United States Patent [19]

Liutkus et al.

[11] Patent Number: 4,780,754

[45] Date of Patent: Oct. 25, 1988

[54] POLYSILOXANE MODIFIED CEMENT

[75] Inventors: John J. Liutkus, Yorktown Heights, N.Y.; Caroline A. Kovac, Ridgefield, Conn.

[73] Assignee: International Business Machines Corporation, Armonk, N.Y.

[21] Appl. No.: 96,701

[22] Filed: Sep. 15, 1987

[51] Int. Cl.⁴ ...................... H01L 49/00; H01L 27/00
[52] U.S. Cl. ...................................... 357/80; 106/104; 106/287.1; 106/287.14
[58] Field of Search ................ 106/104, 287.14, 287.1, 106/314; 357/80

[56] References Cited

U.S. PATENT DOCUMENTS

| | | | |
|---|---|---|---|
| 3,455,710 | 7/1969 | Nitzche et al. | 106/314 |
| 3,816,152 | 6/1974 | Yates | 106/287.14 |
| 4,017,321 | 4/1977 | Reighter | 106/98 |
| 4,121,000 | 10/1978 | Wald | 428/35 |
| 4,125,504 | 11/1978 | Mani et al. | 524/5 |
| 4,231,917 | 11/1980 | Zeldin et al. | 524/650 |

FOREIGN PATENT DOCUMENTS 1194834  6/1970  United Kingdom ............... 106/314

*Primary Examiner*—Steven Capella
*Attorney, Agent, or Firm*—Pollock, Vande Sande & Priddy

[57] ABSTRACT

A cement composition containing cement, water, and a silanol terminated polysiloxane, and cured products thereof exhibiting improved thermal stability and dielectric constant.

29 Claims, No Drawings

POLYSILOXANE MODIFIED CEMENT

TECHNICAL FIELD

The present invention is concerned with cement compositions having improved thermal stability and dielectric constant in the cured state.

The cured cement compositions of the present invention are especially suitable as replacements for ceramics in electronic packaging applications and particularly as the substrate for electronic assemblies.

BACKGROUND ART

Various ceramic materials are used commercially as the substrate for electronic assemblies and especially for large and very large size integrated circuitry (VLSI). The ceramics are suitable for such purposes because of their excellent thermal stability and low dielectric constant. However, the use of ceramics is not entirely satisfactory since such are relatively expensive and require relatively harsh conditions such as temperatures and pressures to fabricate and process.

On the other hand, certain cement compositions that are referred to as macro defect-free (MDF) cements have been investigated as replacements for the ceramics in electronic packaging applications because of their relatively low cost and ease of processing as compared to the ceramics. However, such cements have not been especially successful in view of their poor thermal stability and relatively high dielectric constants which are critical properties for substrates for electronic assemblies. Therefore, it is essential that the thermal stability and dielectric constant characteristics of a cement be improved if cement is to be realized as a suitable replacement for the ceramics.

SUMMARY OF INVENTION

In accordance with the present invention, the thermal stability and dielectric constants of standard macro defect-free cements have been significantly improved. In addition, the relative ease of processing exhibited by the standard cements previously suggested is maintained pursuant to the present invention.

In particular, the present invention is concerned with a cement composition that contains cement, water, and a silanol terminated polysiloxane in an amount sufficient to improve the thermal stability and dielectric constant of the composition when in the cured state. In addition, the present invention is concerned with the cured cement composition that is obtained from the cement, water, and the silanol terminated polysiloxane. The silanol terminated polysiloxane is added in an amount sufficient to improve the thermal stability and dielectric constant of the composition.

The present invention is also concerned with an integrated circuit module wherein the substrate is a cured cement composition obtained from cement, water, and a silanol terminated polysiloxane. The polysiloxane is employed in an amount sufficient to improve the thermal stability and dielectric constant of the composition.

The integrated circuit module can include, among other components, desired pattern of electrical circuitry on at least one major surface of the substrate and/or provision for input/output pins.

Best and Various Modes for Carrying out the Invention

The polysiloxane employed pursuant to the present invention contains silanol terminal groups. Generally, the polysiloxanes employed pursuant to the present invention have viscosities at 25° C. of about 25 centistokes to about 1000 centistokes and a $\overline{M}_v$ of about 500 to about 26,000. The preferred polysiloxanes employed in accordance with the present invention exhibit viscosities of about 25 centistokes to about 75 centistokes with the most preferred polysiloxane exhibiting a viscosity of about 50 centistokes at 25° C.

In addition, the preferred polysiloxanes employed in accordance with the present invention are polydimethyl siloxanes having the silanol terminal groups. One commercially available silanol terminated polydimethyl siloxane is available from Petrarch Systems, Inc. under the trade designation PS-340. This material has a viscosity of about 50 centistokes at 25° C., a $\overline{M}n$ of about 1300, a $\overline{M}_v$ of about 1700, and a $\overline{M}w$ of about 2200.

The silanol terminated polysiloxane is employed in an amount that is sufficient to improve the thermal stability of the cement composition when in the cured state and also to reduce its dielectric constant as compared to the cement composition without any silanol terminated polysiloxane.

The silanol terminated polysiloxane is preferably employed in amounts of about 5% to about 15% by weight and most preferably about 10% by weight based upon about 100 parts of the cement employed.

The cement portion of the composition can be any of the cements that are suitable for providing macro defect-free cement compositions that exhibit electrical insulating characteristics. Examples of such cements are Portland cement and high alumina cement. However, in view of the quantity of iron oxide (e.g.—about 5%) normally found in Portland Cement, such is not especially preferred because of the adverse effect that iron oxide has on electrical properties. In addition, high alumina cement has higher strength characteristics (greater than about 20%) as compared to Portland cement.

Accordingly, the preferred cements employed pursuant to the present invention are the alumina cements that contain relatively high amounts of alumina and relatively minor amounts (e.g.—about 0.1%) of $Fe_2O_3$. In particular, suitable high alumina cements contain about 65% to about 80% by weight of $Al_2O_3$, and about 15% to about 30% by weight of CaO, with about 0.1% to about 5% by weight of impurities in the form of $SiO_2$, MgO, and $Fe_2O_3$.

In addition, there may be trace amounts of other metals such as about 300 ppm sodium, about 300 ppm chromium, about 50 ppm gallium, about 30 ppm vanadium, about 30 ppm manganese, about 30 ppm titanium, and about 3 ppm copper.

A commercially available high alumina cement suitable for the purposes of the present invention is SE-CAR-71 that contains about 70% $Al_2O_3$, about 25% by weight of CaO, and about 5% by weight of various mineral impurities.

The compositions employed in accordance with the present invention also contain water as the hardening agent. Usually about 15 to about 5 parts by weight per 100 parts of the cement are employed. Most preferably about 10 parts by weight per 100 parts of the cement are employed. In addition, in the most preferred aspects of the present invention, the total amount of silanol terminated polysiloxane ahd water is about 10 to about 30 parts by weight and most preferably about 20 parts by weight per hundred parts of the cement.

The compositions of the present invention are prepared by emulsifying the silanol terminated polysiloxane and water with a suitable surfactant, either mechanically, or ultrasonically. Suitable surfactants include polar terminated polyoxyalkylenes which are commercially available such as under the trade designations BRIJ-72 and BRIJ-76 from ICI Americas Inc. The surfactant is usually employed in amounts of about 1–5% by weight and preferably about 3% by weight of the emulsion. The resultant emulsion is then mixed with the cement and sheared, either by rollers or extruders, to effect deflocculation of the agglomerated cement particles.

After the cement, silanol terminated polysiloxane, and water are sheared to provide a paste-like composition, such can be molded to its desired shape, for instance, by molding at about room temperature, and then cured at relatively mild conditions such as at about temperatures of about 70° C. to about 90° C. and preferably at about 80° C., and at relative humidity of about 80% to about 100%, and preferably at about 95%. The cure can be effected in about 12 hours to about 168 hours and preferably about 72 hours.

It has been found, in accordance with the present invention, that the presence of the silanol terminated polysiloxane significantly improves the thermal stability of the cement, as well as significantly reducing its dielectric constant. On the other hand, the addition of carbon backbone synthetic polymers such as copolymers of vinyl alcohol and vinyl acetate actually decreased the thermal stability of the cement.

Additional thermal stability and reduction of dielectric constant of the cement can also be achieved by incorporation of coupling agents to the cement matrix. These can be either of the organofunctional titanates or organofunctional silanes category. Preferred subcategories are the quaternized pyrophosphato titanates, and the alkoxysilanes.

The coupling agents can be added to the cement prior to, subsequent to, or concurrent with the siloxane-water emulsion. The titanates, when present, are usually employed in amounts of about 0.1% to 1.0% by weight of the total composition. The silanes, when present, are usually employed in amounts of about 1% to about 20% by weight of the total composition.

The titanates and silanes are commercially available, such as quaternary methacrylate functional amine adducts, typical of which is available under the trade designation LICA-38J from Kenrich Petrochemicals Inc.

It is further noted that the enhanced thermal stability, whereby temperatures have been obtained in excess of 250° C. and generally at about 290° C. to about 300° C. before degradation occurs, make it possible to use the cements of the present invention for substrates for integrated circuits. For instance, one procedure involved in fabricating electronic circuit modules involves vapor phase solder reflow temperatures which are usually at about 215° C. As noted from above, the compositions of the present invention are compatible for solder applications. In addition, the relatively mild conditions of curing the compositions of the present invention render such compatible with wires, pins, or other delicate materials that might be present in the formed part.

The cement compositions, when employed as a substrate for integrated circuit modules, can include means for providing connectors to connect the substrate to circuit cards or boards. For instance, the substrate can include preformed holes through which input/output pins or similar structures are inserted so as to protrude from one surface of the substrate for insertion into the circuit cards or circuit boards. In addition, if desired, the substrate instead of pins, can use surface-mount connectors for connecting to cards or boards.

The pins, or similar structures, also may protrude or extend slightly from the other surface, referred to as the topside, or may be recessed in a conical hole so as to contact the circuitry on the topside which, in turn, connects to the integrated circuit chip or chips that can be mounted on the topside of the substrate.

When present, the pins and similar structures of the module can be any of the input/output media well-known in the art and need not be discussed herein in any great detail. Examples of suitable pins are gold-plated pins, copper-plated pins, solid copper pins, nickel alloys, copper alloys, and tin-plated pins, clips, and lead frames.

On the topside of the substrate can be present the desired electrical circuitry that connects to the integrated circuit(s) assembled on the substrate. The circuitry can be fabricated by any of the conventional techniques. One such combination is to apply screened on metal circuitry as is well-known in the art.

Integrated circuit chip(s) such as a silicon or polycrystalline silicon chip can be attached to the substrate such as by employing solder bonding.

An example of an arrangement of an integrated circuit module can be found in U.S. Pat. No. 4,233,620 to Darrow, et al., disclosure of which is incorporated herein by reference.

The following non-limiting examples are presented to further illustrate the present invention.

EXAMPLE 1

A composition containing about 100 parts by weight of a high alumina cement, SECAR-71, about 10 parts by weight of water, about 10 parts by weight of a silanol terminated polydimethyl siloxane having a viscosity of about 50 centistokes at 25° C., a $M_n$ of about 1300, a $M_v$ of about 1700, and a $M_w$ of about 2200, and about 0.6 parts by weight of polyoxyalkylene surfactant BRIJ-72 is prepared as follows. The polysiloxane-water-BRIJ-72 mixture is heated to about 80° C. and emulsified ultrasonically for about 2–5 minutes to provide a stable emulsion. The stable emulsion is then added to the cement and mixed to a homogeneous consistency in a mortar. The resultant paste is then sheared between rollers for 2–3 minutes. The sheared paste is molded in a die under 5–10 Kpsi pressure at room temperature. The part is then cured for about 72 hours at a temperature of about 80° C. under a relative humidity of 95%.

The cured cement composition exhibits a thermal stability of about 290° C. to about 300° C. before degradation begins which compares to less than 235° C. for the same cement without the presence of the polysiloxane. In addition, thermal stability tests demonstrate that the weight loss when heating up to about 550° C. is only about 8% as compared to about 20% for the cement without any polysiloxane.

The electrical properties of the cured composition, measured at 1MHz at about 50% relative humidity, are as follows:

| | |
|---|---|
| dielectric constant = | 8.5 |
| dielectric loss = | 0.04 |

$$\text{resistivity} = 5 \times 10^{10} \text{ (ohm-cm)}$$

On the other hand, the cement without any siloxane exhibits a dielectric constant of about 15 and dielectric loss of about 0.08 with resistivity of $5 \times 10^7$ (ohm-cm).

Furthermore, the electrical performance of the polysiloxane modified cements of the present invention are not affected by high humidity.

EXAMPLE 2

Example 1 is repeated, except that about 0.3 parts by weight of titanate coupling agent LICA-38J are added to the water prior to emulsification.

The properties of the cured composition are:

| | |
|---|---|
| dielectric constant = | 3.5 at 1 MHz and 50% RH |
| dielectric loss = | 0.025 at 1 MHz and 50% RH |
| weight loss to 550° C. = | 8% |
| thermal stability = | 320° C. |

EXAMPLE 3

Example 1 is repeated, except that about 16 parts by weight of tetraethoxy silane are added to the cement and mixed to a homogeneous consistency in a mortar prior to mixing with the stable emulsion.

The properties of the cured composition are as follows:

| | |
|---|---|
| dielectric constant = | 9 at 1 MHz and 50% RH |
| weight loss to 550° C. = | 15% |
| thermal stability = | 260° C. |

Having thus described our invention, what we claim as new and desire to secure by Letters Patent is:

1. A cement composition containing a high alumina cement, water, and a silanol terminated polysiloxane in an amount sufficient to increase the thermal stability and reduce the dielectric constant of the composition when in the cured state and wherein said polysiloxane is employed in an amount of about 5 to 15 parts by weight based upon 100 parts by weight of said cement.

2. The cement composition of claim 1 wherein said polysiloxane is employed in an amount of about 10 parts by weight based upon 100 parts by weight of said cement.

3. The cement composition of claim 1 wherein said polysiloxane has a viscosity at 25° C. of about 25 to about 1000 centistokes.

4. The cement composition of claim 1 wherein said polysiloxane has a viscosity at 25° C. of about 25 to 75 centistokes.

5. The cement composition of claim 1 wherein said polysiloxane has a viscosity at 25° C. of about 50 centistokes.

6. The cement composition of claim 6 wherein said polysiloxane is a polydimethyl siloxane having an $M_n$ of about 1300, an $M_v$ of about 1700, and an $M_w$ of about 2200.

7. The cement composition of claim 1 wherein the water is employed in an amount of about 5 to 15 parts by weight per 100 parts by cement.

8. The cement composition of claim 1 wherein the water is employed in an amount of about 10 parts by water per 100 parts of cement.

9. The cement composition of claim 7 wherein the total of polysiloxane and water is about 10 to about 30 parts by weight per 100 parts of cement.

10. The cement composition of claim 1 wherein the water is employed in an amount of about 10 parts and said polysiloxane in an amount of about 10 parts per 100 parts of cement.

11. The cement composition of claim 1 that further includes a coupling agent.

12. The cement composition of claim 11 wherein said coupling agent is an organofunctional titanate in an amount of about 0.1% to 1% by weight of the composite or an organofunctional silane in an amount of about 1% to about 20% by weight of the total composition.

13. The cement composition of claim 1 wherein said cement contains about 65% to about 80% by weight of $Al_2O_3$.

14. The cement composition of claim 13 wherein said cement further contains about 15% to about 30% by weight of CaO.

15. A cured cement composition obtained from high alumina cement, water, and a silanol terminated polysiloxane in an amount sufficient to increase the thermal stability and reduce the dielectric constant of the composition and wherein said polysiloxane is employed in an amount of about 5 to 15 parts by weight based upon 100 parts by weight of said cement.

16. The cement composition of claim 15 wherein said polysiloxane is employed in an amount of about 10 parts by weight based upon 100 parts by weight of said cement.

17. The cement composition of claim 15 wherein said polysiloxane has a viscosity at 25° C. of about 25 to about 1000 centistokes.

18. The cement composition of claim 15 wherein said polysiloxane has a viscosity at 25° C. of about 25 to 75 centistokes.

19. The cement composition of claim 15 wherein said polysiloxane has a viscosity at 25° C. of about 50 centistokes.

20. The cement composition of claim 19 wherein said polysiloxane is a polydimethyl siloxane having an Mn of about 1300, an Mv of about 1700, and an Mw of about 2200.

21. The cement composition of claim 15 wherein the water is employed in an amount of about 5 to 15 parts by weight per 100 parts by cement.

22. The cement composition of claim 15 wherein the water is employed in an amount of about 10 parts by water per 100 parts of cement.

23. The cement composition of claim 21 wherein the total of polysiloxane and water is about 10 to about 30 parts by weight per 100 parts of cements.

24. The cement composition of claim 15 wherein the water is employed in an amount of about 10 parts and said polysiloxane in an amount of about 10 parts per 100 parts of cement.

25. The cement composition of claim 15 that further includes a coupling agent.

26. The cement composition of claim 15 wherein said coupling agent is an organofunctional titanate in an amount of about 0.1% to 1% by weight of the composite or an organofunctional silane in an amount of about 1% to about 20% by weight of the total composition.

27. The cement composition of claim 15 wherein said cement contains about 65% to about 80% by weight of $Al_2O_3$.

28. The cement composition of claim 27 wherein said cement further contains about 15% to about 30% by weight of CaO.

29. An integrated circuit sub-assembly which comprises:
- a substrate obtained by curing a composition comprising high alumina cement, water, and a silanol terminated polysiloxane in an amount sufficient to increase the thermal stability and reduce the dielectric constant and wherein said polysiloxane is employed in an amount of about 5 to about 15 parts by weight based upon 100 parts by weight of said cement, and
- electrically conductive circuitry on at least one of the major surfaces of said substrate.

* * * * *